(12) United States Patent
Schmidt et al.

(10) Patent No.: US 11,032,902 B2
(45) Date of Patent: Jun. 8, 2021

(54) ELECTRO-OPTICAL STRUCTURE

(71) Applicant: Deutsches Zentrum für Luft- und Raumfahrt e.V., Cologne (DE)

(72) Inventors: Christopher Schmidt, Munich (DE); Christian Fuchs, Munich (DE)

(73) Assignee: Deutsches Zentrum für Luft- und Raumfahrt e.V., Cologne (DE)

( * ) Notice: Subject to any disclaimer, the term of this patent is extended or adjusted under 35 U.S.C. 154(b) by 0 days.

(21) Appl. No.: 16/344,513

(22) PCT Filed: Oct. 25, 2017

(86) PCT No.: PCT/EP2017/077290
§ 371 (c)(1),
(2) Date: Apr. 24, 2019

(87) PCT Pub. No.: WO2018/077941
PCT Pub. Date: May 3, 2018

(65) Prior Publication Data
US 2020/0053872 A1    Feb. 13, 2020

(30) Foreign Application Priority Data

Oct. 26, 2016   (DE) ..................... 10 2016 221 137.4

(51) Int. Cl.
*H05K 1/16* (2006.01)
*H05K 1/02* (2006.01)
*H05K 1/05* (2006.01)
*H05K 1/09* (2006.01)
*H05K 1/11* (2006.01)
*H05K 1/18* (2006.01)

(52) U.S. Cl.
CPC ......... *H05K 1/0274* (2013.01); *H05K 1/0204* (2013.01); *H05K 1/056* (2013.01); *H05K 1/09* (2013.01); *H05K 1/115* (2013.01); *H05K 1/181* (2013.01); *H05K 2201/068* (2013.01); *H05K 2201/10121* (2013.01)

(58) Field of Classification Search
USPC ....................................... 361/767
See application file for complete search history.

(56) References Cited

U.S. PATENT DOCUMENTS

| 5,006,417 | A | 4/1991 | Jackson et al. |
| 6,043,482 | A * | 3/2000 | Hagl ............... G01D 5/34715 250/231.13 |
| 6,639,155 | B1 | 10/2003 | Bupp et al. |
| 2002/0181110 | A1* | 12/2002 | Bower ............ G02B 26/0841 359/599 |

(Continued)

FOREIGN PATENT DOCUMENTS

| EP | 0346038 A1 | 12/1989 |
| EP | 3045945 A1 | 7/2016 |

*Primary Examiner* — Andargie M Aychillhum
(74) *Attorney, Agent, or Firm* — The Webb Law Firm

(57) ABSTRACT

An electro-optical structure including at least one optical component and a plurality of electric components arranged on a common printed circuit board is disclosed herein. The printed circuit board includes a plate-shaped base body made of molybdenum or an Invar material. An optical bench including a printed circuit board with a plate-shaped base body of molybdenum or an Invar material is also disclosed herein.

9 Claims, 2 Drawing Sheets

(56) References Cited

U.S. PATENT DOCUMENTS

| | | | |
|---|---|---|---|
| 2003/0206703 A1* | 11/2003 | Chiu | G02B 6/4208 |
| | | | 385/93 |
| 2009/0283900 A1* | 11/2009 | Yamada | H01L 23/3128 |
| | | | 257/698 |
| 2010/0309483 A1 | 12/2010 | Crowther | |
| 2011/0234238 A1* | 9/2011 | Herrman | G01R 31/2896 |
| | | | 324/551 |
| 2016/0274317 A1 | 9/2016 | Tsujita et al. | |

* cited by examiner

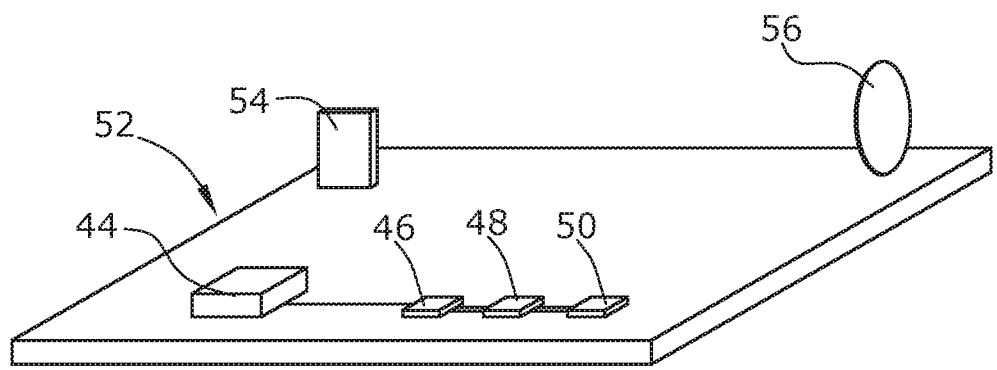
Fig.3
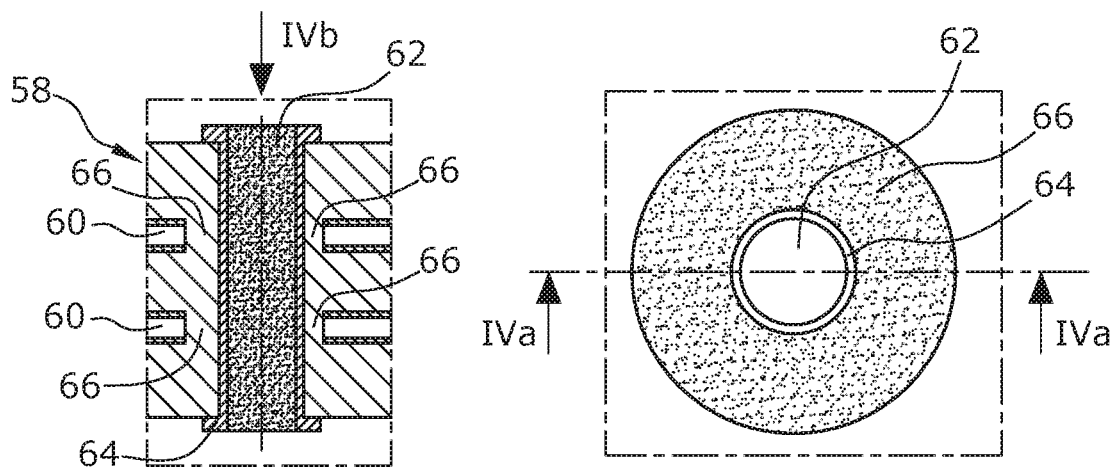
Fig.4a      Fig.4b
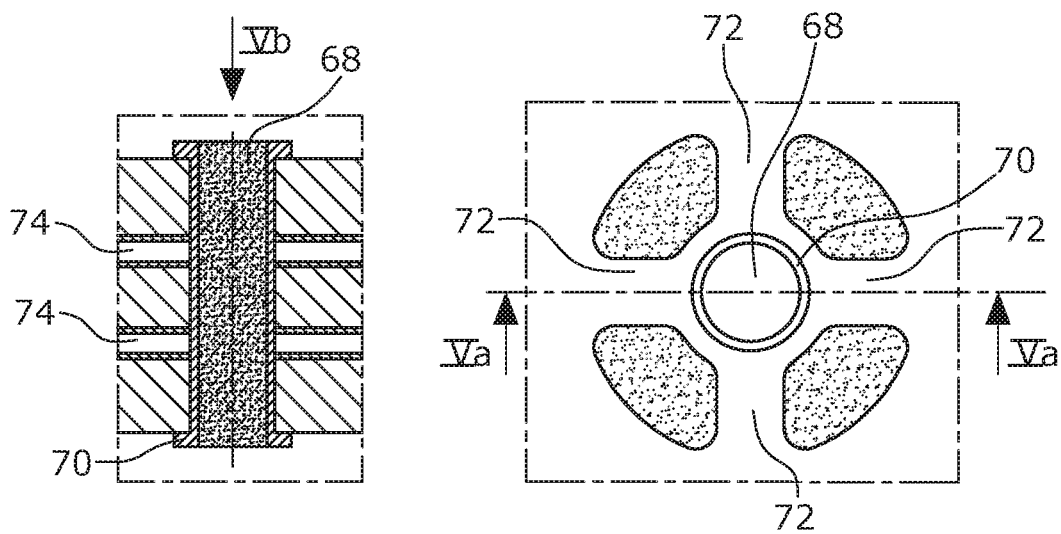
Fig.5a      Fig.5b

ELECTRO-OPTICAL STRUCTURE

CROSS-REFERENCE TO RELATED APPLICATIONS

This application is the United States national phase of International Application No. PCT/EP2017/077290 filed Oct. 25, 2017, and claims priority to German Patent Application No. 10 2016 221 137.4 filed Oct. 26, 2016, the disclosures of which are hereby incorporated by reference in their entirety.

BACKGROUND OF THE INVENTION

The disclosure relates to an electro-optical structure comprising a common printed circuit board for accommodating both electric and optical components.

Usually, electric circuits are mounted on a printed circuit board. The electronic components are connected via conductor traces according to a circuit diagram, which conductor traces are inserted by an etching process into a copper coating of the printed circuit board. However, when systems, in particular for optical communication, are built both electronic components and optical components are used. Usually, the electronic components are mounted on a printed circuit board. The optical components are mounted on an optical bench configured as a base plate by means of which stable mounting of the optical components is ensured.

At present, mainly lightweight materials, such as aluminum or carbon fiber, are used for building an optical bench. These materials have a high stability and a comparably small thermal expansion such that the optical systems can be mounted in a stable manner. With a view to a high stability, optical benches normally have a thickness of up to several centimeters. However, these materials do not allow any electronic components or conductor traces to be mounted thereon, so that the electronic system and the optical bench are physically separated from each other. However, both components are absolutely necessary in a system for freespace optical communication, for example. The use of an optical bench and separate printed circuit boards for mounting the electric components leads to an increased volume and weight of the communication system.

The separate setup of an optical bench and a printed circuit board prevents extremely lightweight and compact configurations since the separation between optical bench and printed circuit board for mounting electronic components does not allow for maximum miniaturization of the system.

It is an object of the disclosure to realize a compact electro-optical structure.

SUMMARY OF THE INVENTION

According to the disclosure, the electro-optical structure comprises at least one optical component and a plurality of electric components, wherein the electric components are connected with each other in particular to form an electric circuit. The optical components are lenses, mirrors, gratings and the like, for example. The electric components are a laser diode, an amplifier, a controller, further active or passive electric components and the like, for example. According to the disclosure, the optical components and the electric components are located on a common printed circuit board.

In particular, the electro-optical structure realizes an optical communication system and a freespace communication system on a single printed circuit board which serves as both a printed circuit board for the required electric circuit and as an optical bench for mounting the optical components. A separate optical bench, which would increase the complexity and the space required by the system, is thus not required.

Preferably, the electric components are connected with each other via conductor traces, wherein the conductor traces are integrated, in particular adapted to be etched, in an outer copper layer. In particular, materials other than copper can be used as the outer layer for electrically connecting the electric components with each other. Further, the manufacturing of the conductor traces is not limited to etching.

Thus, by integrating the conductor traces, a compact electro-optical structure is created which is realized on a single printed circuit board.

Preferably, the printed circuit board has a thermal expansion coefficient of smaller than 9 µm/K. This ensures that optical components on the printed circuit board keep a stable position relative to each other even at different temperatures, in particular in the case of a heat input by the electric components, such that the optical system arranged on the printed circuit board is not affected by the thermal expansion.

Preferably, the electro-optical structure comprises a plate-shaped base body. Here, plate-shaped means that the base body as a small height as compared with the length and the width of the base body. The height of the base body may be a few millimeters, whereas the length and the width of the base body may be several centimeters. The base body is made from molybdenum or an Invar material. The Invar material is a class of alloys, in particular on an iron, nickel and cobalt basis, all of which have a small thermal expansion coefficient. Invar materials are not limited to iron-nickel alloys Fe65Ni35 Invar offered and sold under the trade name Invar® and also under the designation Invar 36, Nilo alloy 36, Nilvar, NS 36, Permalloy D, Radio metal 36 or Vacodil36 (material no. 1.3912). The use of molybdenum or an Invar material according to the disclosure ensures that the base body has only a very small thermal expansion such that both electric and optical components can be arranged on the printed circuit board according to the disclosure without the local heat input of the electric components causing the optical system made up of the optical components to be affected. In particular, the base body has a thermal expansion coefficient of smaller than 9 µm/K.

Preferably, the Invar material is an alloy from the list of FeNi, FePt, FePd, FeMn, CoMn, FeNiPt, FeNiMn, FeNiCo, CoMnFe, CrFe, CrMn, CoCr, FeB or FeP.

Preferably, the Invar material is a FeNi alloy with 30 to 40 mass percent of Ni. This also includes Invar®, for example. Alternatively, the Invar material preferably is a FeNiCo alloy with 25 to 35 mass percent of Ni and up to 20 mass percent of Co. By alloying of cobalt, the thermal expansion coefficient can be further reduced. These alloys include in particular the commercially available alloys Inovco® as well as Kovar®.

Preferably, the base body is coated or plated with copper for increasing the thermal conductivity of the printed circuit board and ensuring an efficient heat distribution inside the printed circuit board. More preferably, the base body is coated with copper on both sides. Thereby, the thermal conductivity of the base body is further improved. Further, on the second side a filler layer is in particular arranged on the copper.

In particular, a filler layer is arranged on the copper. The filler layer, which acts as an electrical insulation, insulates the copper-plated base body from the currents of the electric components. This allows electric components to be arranged on the filler layer and to be connected via conductor traces according to a circuit diagram.

Preferably, the printed circuit board comprises further layers of copper and filler layers.

Preferably, a plurality of molybdenum or Invar layers are provided inside the printed circuit board. This allows for configuring a stable printed circuit board and minimizing the effects of thermal stress.

Preferably, the printed circuit board has a symmetrical cross-section with regard to the layer sequence. Thereby, the effect of the unilateral local heat input by the electric components is reduced and in particular the thermal stresses are minimized by a homogenous heat distribution inside the printed circuit board.

Preferably, the filler layer is made from preimpregnated fibers which are suited for electrically insulating the base body from the electric components, where required. Preimpregnated fibers are usually designated as Prepreg (in English short for: preimpregnated fibers). They usually comprise a resin-impregnated textile or fiber assembly.

Preferably, another copper layer is arranged on the filler layer or a copper layer is provided as the outermost layer for accommodating or forming the conductor traces which connect the electric components with each other. Thereby, portions of this outer copper layer can be removed by etching or the like such that merely the electric connections remain according to a circuit diagram and electrically connect the electric components with each other. Instead of copper, other metals or alloys can be used which are suited for ensuring an electrical contact between the electric components Preferably, the base body is used as earth for the electric circuit made up of the electric components or for their power supply.

Preferably, the printed circuit board comprises a plurality of holes for fastening the optical and electric components. Thermally insulated holes may be provided in particular for the optical components. These thermally insulated holes are lined with copper without any metallic connection to the base body. Alternatively or additionally, the printed circuit board may comprise thermally connected holes in particular for accommodating the electric components such that the heat released by the latter can be efficiently introduced into the base body. The holes are internally coated with copper in with the material of the outermost layer. This coating is directly connected with the base body made from molybdenum or Invar. Due to the metallic connection the generated heat is directly dissipated into the base body and distributed as uniformly as possible inside the printed circuit board.

The disclosure further relates to the use of a printed circuit board as an optical bench for accommodating both electric components and optical components. Thereby, a compact electric-optical structure can be realized since a separate optical bench is not required.

Preferably, the printed circuit board comprises a plate-shaped base body, wherein the base body is made from molybdenum or an Invar material.

Preferably, the use allows for realizing an electro-optical structure which is further developed according to the above description.

BRIEF DESCRIPTION OF THE DRAWINGS

Hereunder the disclosure is explained in detail with reference to the accompanying drawing in which:

FIG. 3 shows an electro-optical structure according to the disclosure, FIGS. 4a and 4b show thermally insulated holes according to the disclosure, and FIGS. 5a and 5b show thermally connected holes according to the disclosure.

DESCRIPTION OF THE INVENTION

Figure 1:
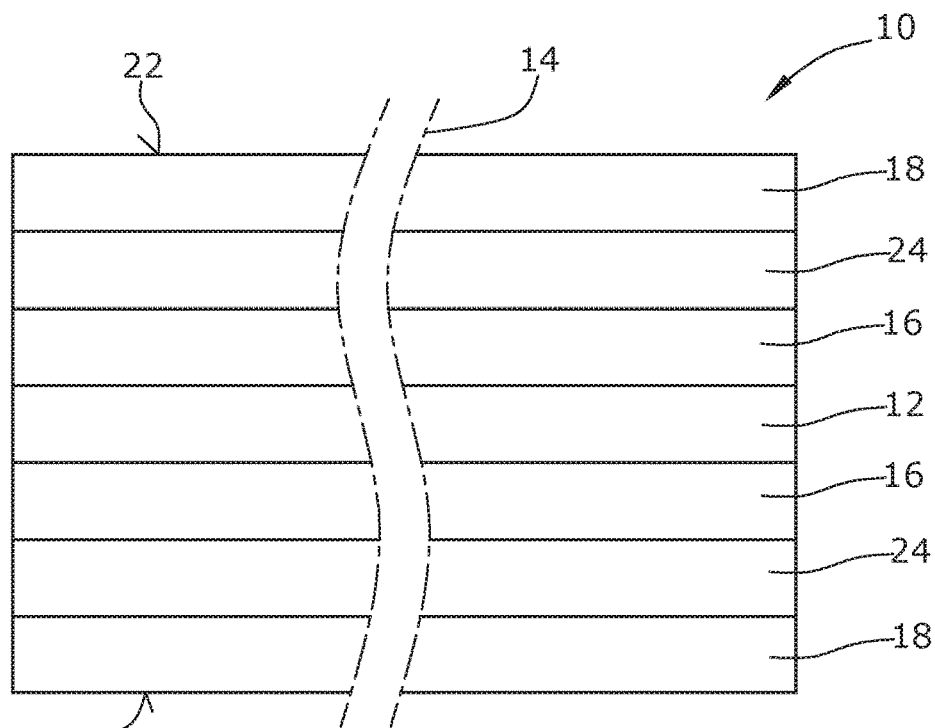
FIG. 1 shows a cross-sectional view of a first layer structure of a printed circuit board for an electro-optical structure according to the disclosure.

In a first configuration of a printed circuit board 10, shown in FIG. 1, for an electro-optical structure according to the disclosure said printed circuit board comprises a plate-shaped base body 12. The plate-shaped configuration of the base body 12 and of the printed circuit board 10 in general is illustrated in FIG. 1 by the ellipses 14. The printed circuit board 10 merely has a thickness of a few millimeters, in particular 1.5 mm-10 mm. In contrast, the printed circuit board has a length and a width of several centimeters and is large enough for accommodating all electronic and optical components. The plate-shaped base body 12 of the printed circuit board is made from an Invar material, for example Fe65Ni35. The base body is coated or plated with a copper layer 16 on both sides. In addition, the printed circuit board 10 comprises an outer copper layer 18 both on the lower side 20 and on the upper side 22. Thus the structure of the printed circuit board 10 is symmetrical around the base body 12 made from the Invar material. In the outermost copper coating 18 on the upper side 22 conductor traces may be integrated which electrically connect the electric components, which can be arranged on the printed circuit board, according to a circuit diagram. Between the outermost copper layer 18 and the copper layer 16 directly connected with the base body 12 a respective filler layer 24 is arranged which electrically insulates the outer copper layer 18 from the inner copper layer 16. The filler layer 24 is made up of cured preimpregnated fibers, so-called Prepreg.

Figure 2:
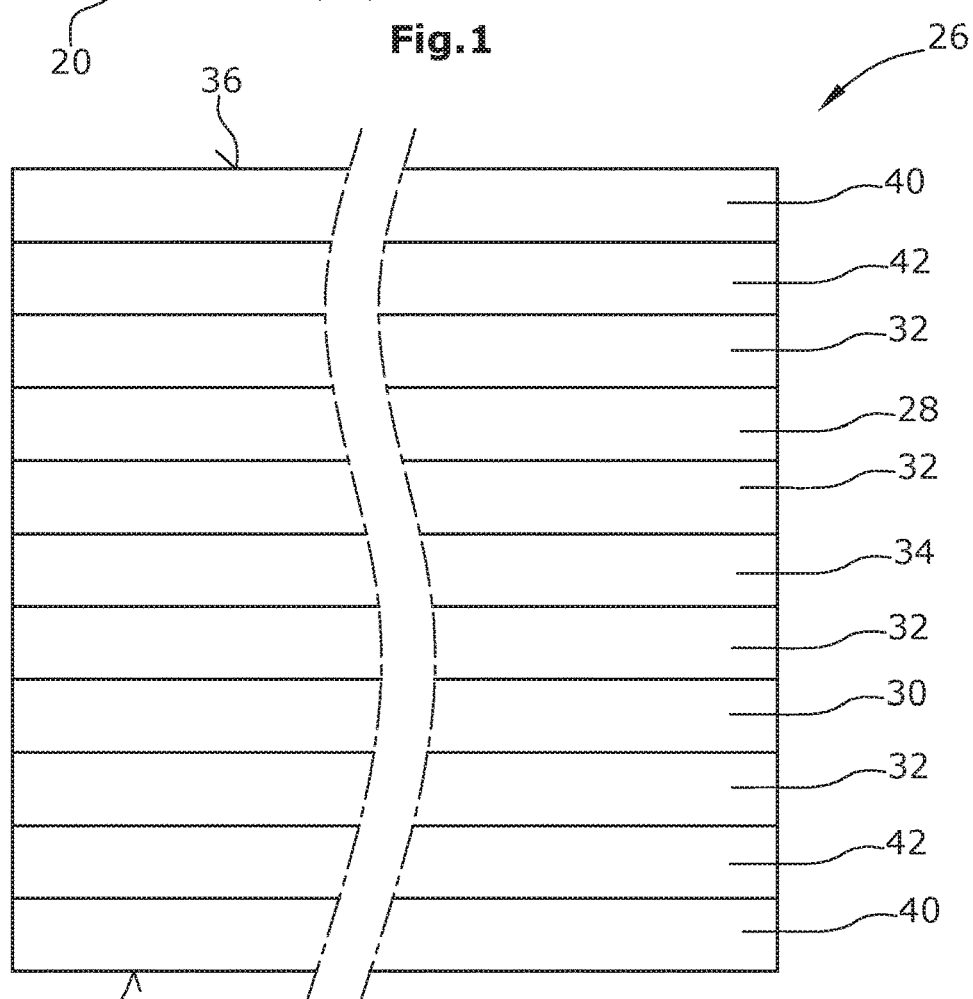
FIG. 2 shows a cross-sectional view of a second layer structure of a printed circuit board for an electro-optical structure according to the disclosure.

According to a second embodiment, shown in FIG. 2, the printed circuit board 26 comprised a first plate-shaped base body 28 made from an Invar material as well as a second plate-shaped base body 30 also made from an Invar material. Both the first base body 28 and the second base body 30 are directly coated with a copper layer 32 on both sides. The copper-plated first base body 28 is connected with the copper-plated second base body 30 via a filler layer 34. Both on the upper side 36 and on the lower side 38 an outer copper layer 40 is arranged which is respectively connected with the base bodies via a filler layer 42. In this exemplary embodiment, too, the structure of the printed circuit board 26 is symmetrical for minimizing thermal stresses caused by heat introduced by the electronic components arranged on the surface 36.

FIG. 3 schematically shows an electro-optical structure. Electric components, such as a laser diode 44, an amplifier 46, a controller 48 and a power supply unit 50, are arranged on a common printed circuit board 52. The common printed circuit board 52 again comprises an Invar base body copper-plated on both sided, for example, or, alternatively, a copper-plated molybdenum body. In addition, on the common printed circuit board 52 optical components, such as a mirror 54 or a lens 56, are arranged for guiding and modifying the laser light of the laser diode 44. Due to the structure of the common printed circuit board 52 the latter has a thermal expansion coefficient of smaller than 9 μm/K such that the relative position of the optical components with respect to each other is changed only to a small extent by the local heat input generated by the electric components 44, 46, 48 and 50. Thereby, it is possible to arrange electric components 44, 46, 48 and 50 together with optical components 54, 56 on a common printed circuit board 52. Thus a separate optical bench is not required. Thereby, the structure of the electro-optical system is strongly simplified.

Another control of the heat balance of the printed circuit board is performed via the insulated fastening holes, in particular for optical components, as shown in FIGS. 4a and 4b. The printed circuit board 58 comprises two Invar base bodies 60 each of which is copper-plated. A bore 62 is copper-plated 64 from inside. The copper coating has no metallic connection to the two Invar base bodies 60. In particular, the gap 66 ensures that the heat transfer from the Invar base bodies 60 to the fastening sites or the optical components fastened to the fastening sites is small.

Alternatively, in particular electric components can be fastened in thermally connected holes, as shown in FIGS. 5a and 5b. The latter comprise a bore 68 whose inner surface is coated with copper 70. The inner coating 70 is directly connected with the two existing Invar base bodies 74 via webs 72 such that heat generated by the electric components fastened in the bore 68 can be effectively dissipated via a large surface formed by the copper-plated Invar cores. Thereby, generated heat is quickly distributed such that a reduction of the local excess temperature leads to a reduced thermal stress.

The invention claimed is:

1. An electro-optical structure, comprising: at least one optical component, a plurality of electric components, wherein the at least one optical component and the plurality of electric components are arranged on a common printed circuit board, wherein the common printed circuit board is rigid to provide sufficient stability in order to ensure stable mounting of the optical components such that the common printed circuit board serves as an optical bench, wherein the printed circuit board has a thermal expansion coefficient smaller than 9 pm/K, wherein the printed circuit board comprises a plate-shaped base body, and wherein the base body comprises molybdenum or an Invar material.

2. The electro-optical structure according to claim 1, wherein the plurality of electric components are connected with each other via conductor traces, and wherein the conductor traces are integrated in the printed circuit board.

3. The electro-optical structure according to claim 1, wherein the Invar material is at least one of the following alloys: FeNi, FePt, FePd, FeMn, CoMn, FeNiPt, FeNiMn, FeNiCo, CoMnFe, CrFe, CrMn, CoCr, FeB, or FeP.

4. The electro-optical structure according to claim 1, wherein the Invar material is a FeNi alloy comprising 30 to 40 mass percent of Ni.

5. The electro-optical structure according to claim 1, wherein the base body comprises a copper coating on a first and a second side.

6. The electro-optical structure according to claim 1, wherein the printed circuit board comprises a symmetrical layer structure as seen in the cross section.

7. The electro-optical structure according to claim 1, wherein the electro-optical structure is an optical freespace communication system.

8. The electro-optical structure according to claim 1, wherein the Invar material is an FeNiCo alloy comprising 25 to 35 mass percent of Ni and less than or equal to 20 mass percent of Co.

9. An optical bench comprising a printed circuit board that is rigid to provide sufficient stability in order to ensure stable mounting of optical components such that the printed circuit board serves as an optical bench, wherein the printed circuit board comprises a plate-shaped base body, and wherein said base body comprises molybdenum or an Invar material, wherein the Invar material is an FeNiCo alloy comprising 25 to 35 mass percent of Ni and less than or equal to 20 mass percent of Co.

\* \* \* \* \*